US006657425B2

(12) United States Patent
Sowlati et al.

(10) Patent No.: US 6,657,425 B2
(45) Date of Patent: Dec. 2, 2003

(54) POWER MEASUREMENT CIRCUIT INCLUDING HARMONIC FILTER

(75) Inventors: Tirdad Sowlati, Ossining, NY (US); Sifen Luo, Hartsdale, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 41 days.

(21) Appl. No.: 09/891,668

(22) Filed: Jun. 26, 2001

(65) Prior Publication Data

US 2002/0196044 A1 Dec. 26, 2002

(51) Int. Cl.[7] .............................................. G01R 25/02
(52) U.S. Cl. ...................................... 324/95; 324/158.1
(58) Field of Search ................................. 324/763, 733, 324/734, 95; 327/538–544, 552–559; 455/671, 115, 226

(56) References Cited

U.S. PATENT DOCUMENTS 4,868,613 A * 9/1989 Hirachi ....................... 257/532
5,019,782 A * 5/1991 Schatter .................. 324/207.26
5,347,229 A * 9/1994 Suckling et al. ............. 330/251
5,397,913 A * 3/1995 Takata et al. ................ 257/567
6,054,898 A * 4/2000 Okuma et al. ............... 330/266
6,348,818 B1 * 2/2002 Filipovski ..................... 326/88

* cited by examiner

*Primary Examiner*—Kamand Cuneo
*Assistant Examiner*—Tung X. Nguyen
(74) *Attorney, Agent, or Firm*—Steven R. Biren

(57) ABSTRACT

A shorting element, preferably a resonant inductor-capacitor circuit, is inserted in parallel with a sense transistor, which itself is in parallel with a power transistor. The use of the shorting element in combination with the sense transistor, provides a technique to have a monotonic power detection. The shorting element eliminates extraneous currents caused by inherent collector-base and collector-substrate diodes of sense transistor, and also eliminates the extraneous collector voltage swing of the sense transistor caused by mutual coupling between inductors connected to the power and sense transistors.

10 Claims, 5 Drawing Sheets

POWER MEASUREMENT CIRCUIT INCLUDING HARMONIC FILTER

TECHNICAL FIELD

The present invention relates to monitoring circuitry, and more specifically, to an improved technique of monitoring power delivered by power amplifiers, transistors and the like, when used in specific applications such as wireless communications.

BACKGROUND OF THE INVENTION

Solid state power devices are utilized in a variety of applications including wireless signal generation. In such applications, it is necessary and/or desirable to ascertain the amount of power being output by the particular device.

FIG. 1 shows an exemplary prior art circuit arrangement for measuring power delivered to a load 101 by a radio frequency (RF) signal input through capacitor 102. The actual chip is shown as enclosed by outline 103, with capacitor 102, circuitry 104, and transistors Q1 and Q2 "on chip". Bonding pads 110 through 112 represent the interface from the actual chip to the pin when transmitting the signal off chip. Inductor 114 represents a ground inductance, and inductors 115 and 116 represent inherent inductors such as inductance caused by the wire bond as well as the lead frame inductance of a chip package.

Typically, the load 101 is driven by the RF signal 130 through an off chip-matching network 132. In order to measure the power being delivered to the load, several techniques are available. Some involve constructing a voltage divider circuit and then measuring a fraction of the signal applied to the load. Others utilize an off chip averaging circuit. Plural other techniques exist as well.

The arrangement of FIG. 1 describes one prior art technique for measuring the power delivered to the load. More specifically, transistor $Q_2$ is selected at a value much smaller than transistor $Q_1$, such that the current through transistor $Q_2$ is only 1% or less of that through $Q_1$. An averaging circuit includes resistor 140 and capacitor 142.

FIG. 2 shows a graph of the voltage at the point $V_{detect}$ in FIG. 1, as a function of the power delivered by the device. Notably, at approximately 1.8 watts, the slope of the curve in FIG. 2 becomes positive. This change in slope is due to several factors. One reason for the change in slope can be appreciated from a review of FIG. 3, a close up of transistor $Q_2$ showing the inherent base collector diode 301 and the substrate collector diode 302. Both of these diodes are inherent in the device and are result of the physics of fabrication. However, at high power levels, these diodes become forward biased and introduce extra current paths into the collector of $Q_2$. Accordingly, the current being measured and shown as i_sense in FIG. 1 is no longer an accurate measure of the power being delivered by the device. Instead, the measured signal is distorted because the high voltage variations at relatively high power cause additional current paths into the collector of $Q_2$. Additionally, the coupling between inductors 115 and 116 causes further errors in the current i_sense. As a result, the measurement system shown in FIG. 1 only works for lower power signals, but does not operate properly at higher powers.

In view of the above, there exists a need in the art for an improved technique of providing current and power measurement in devices at high output power levels. This issue is particularly important in wireless communications devices, where circuitry similar to that shown in FIG. 1 is used.

It is an object of the invention to provide such power measurement in a manner that does not require the use of large components and bulky, lossy devices.

SUMMARY OF THE INVENTION

The above and other problems of the prior art are overcome in accordance with the present invention. A measurement transistor Q2 is connected in parallel with the power transistor Q1. A shorting device is connected in parallel with the measurement transistor in order to short signals to ground, but only signals that are substantially the same as the frequency of an input RF signal. In a preferred embodiment, the shorting device is an inductor/capacitor (LC) resonant circuit.

In accordance with the invention, high frequency signals, which would vary greatly in voltage and cause the additional current paths discussed above are shorted to ground. By utilizing a resonant circuit, use of a large capacitor is avoided, yet the desired impedance in the shorting device is achieved.

In an additional preferred embodiment, the capacitor for the shorting device is constructed on chip, and the inductor portion of the LC resonant circuit comprises inherent inductance in a chip-bonding pad.

DETAILED DESCRIPTION OF THE DRAWINGS

Figure 4:
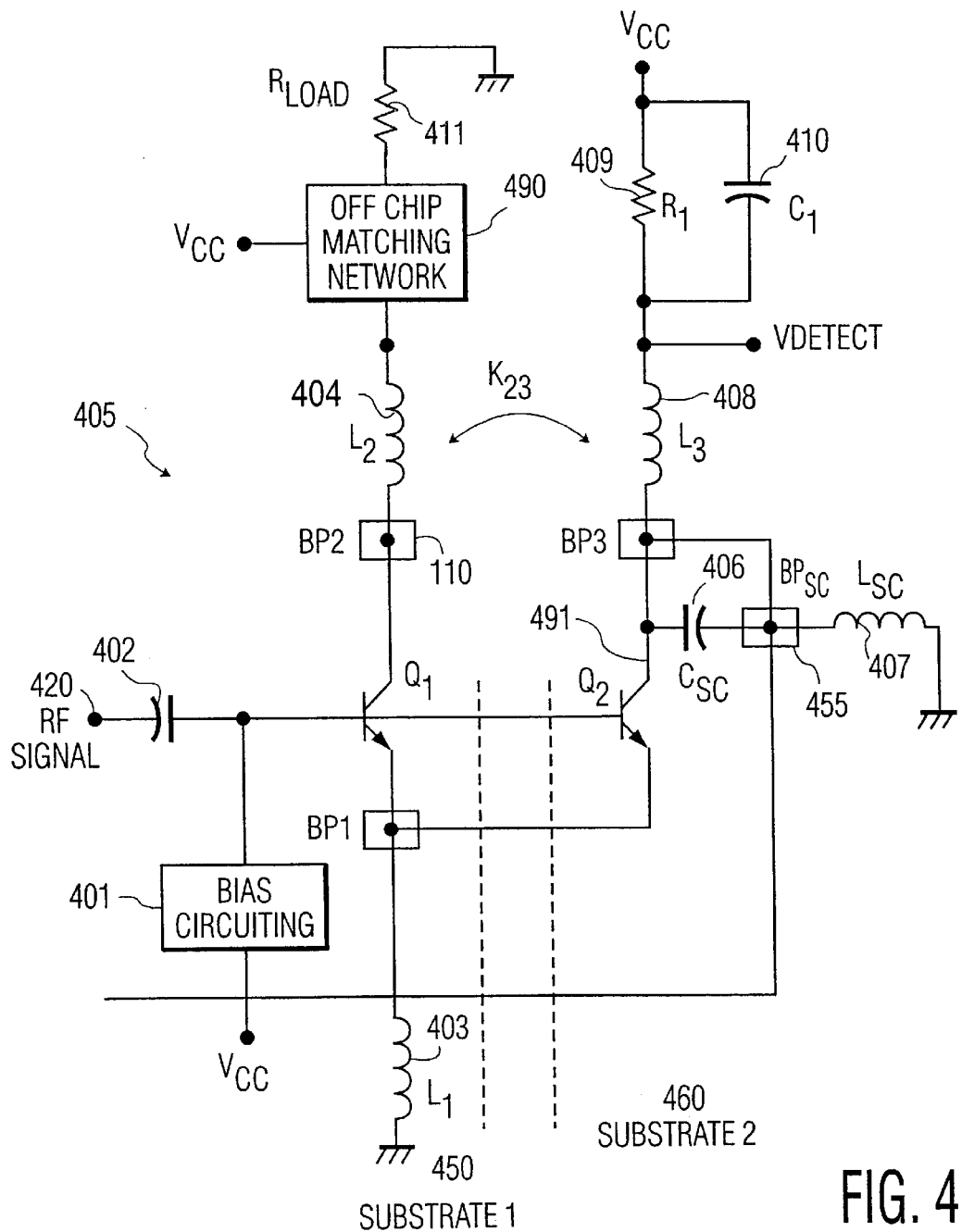
FIG. 4 shows an exemplary embodiment of the present invention.

FIG. 4 shows an exemplary embodiment of the present invention. In operation, an RF signal 420 is injected through capacitor 402 and transistor $Q_1$. Bias circuitry 401 operates in a conventional fashion. The averaging circuit formed by resistor 409 and capacitor 410 provides a DC voltage at $V_{detect}$, which is substantially proportional to the power being delivered to load resistor 411.

However, the current caused by this $V_{detect}$, and thus as measured through transistor $Q_2$, is distorted by the effects previously described. Specifically, the coupling between inductors 408 and 404, and the inherent diodes between the collector of transistor $Q_2$ and the substrate 2, as well as the base collector diode, all cause current distortions which would lead to inaccurate measurements.

The presence of capacitor 406 and inductor 407 serves to minimize and/or eliminate high frequency components in the signal at the collector of $Q_2$. These high frequency components are variations, which cause additional current components and thus distort the measure of the power delivered to the load 411.

Preferably, capacitor 406 and inductor 407 are arranged with values to resonate at the desired operating frequency. As is well known, the series connection of an LC resonant circuit appears as a short circuit at the critical frequency, that at which the RF signal is delivered. Moreover, the capacitor may be added on chip with minimal cost, and the inductor 407 is a wire bond inductance, inherent in the system anyway.

In the preferred embodiment, further elimination of unwanted extraneous signals at the collector of $Q_2$ is achieved by increasing the resistance between the substrate level on which $Q_1$ is deposited, and a second substrate level on which $Q_2$ is deposited. One such technique involves placing a substrate tap around $Q_2$, which is separate from the tap placed around $Q_1$. Regardless of the technique used, the substrates are isolated with an increased resistance so as to effectively and substantially eliminate the cross inductance caused by the coupling of L2 and L3.

Figure 1:
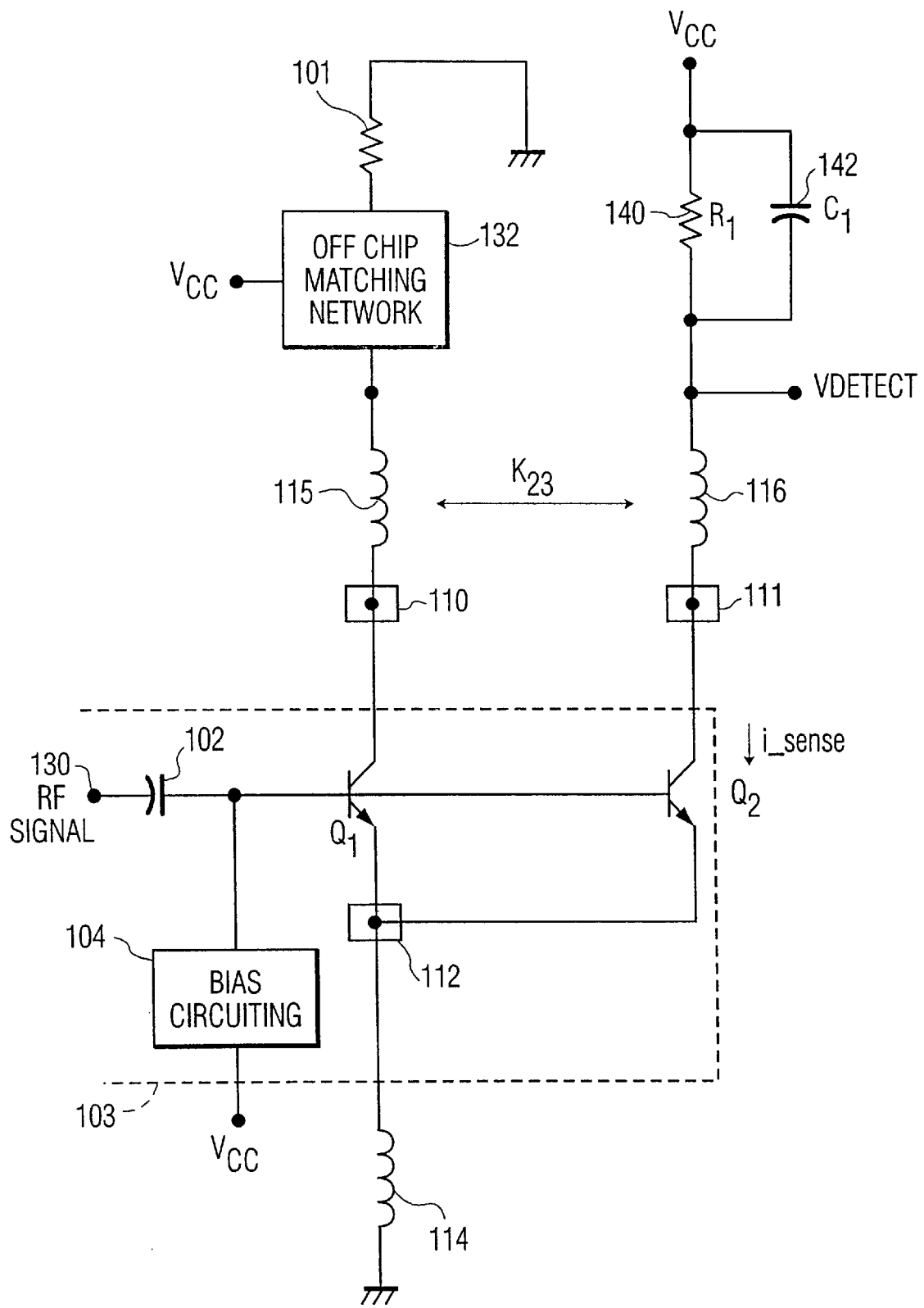
FIG. 1 depicts a prior art arrangement for measuring power delivered to a load.
Figure 2:
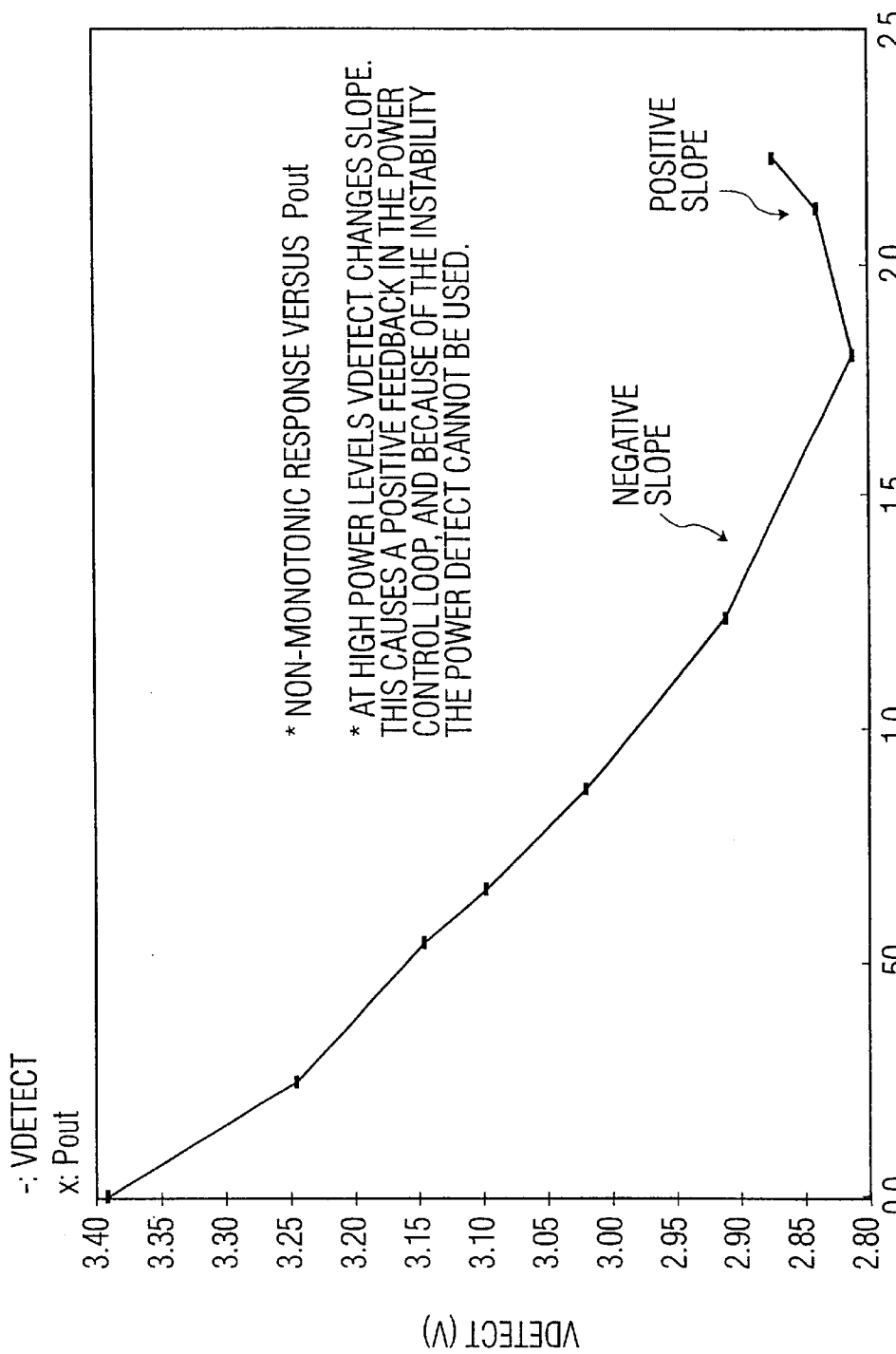
FIG. 2 shows a voltage power curve for the arrangement of FIG. 1.
Figure 5:
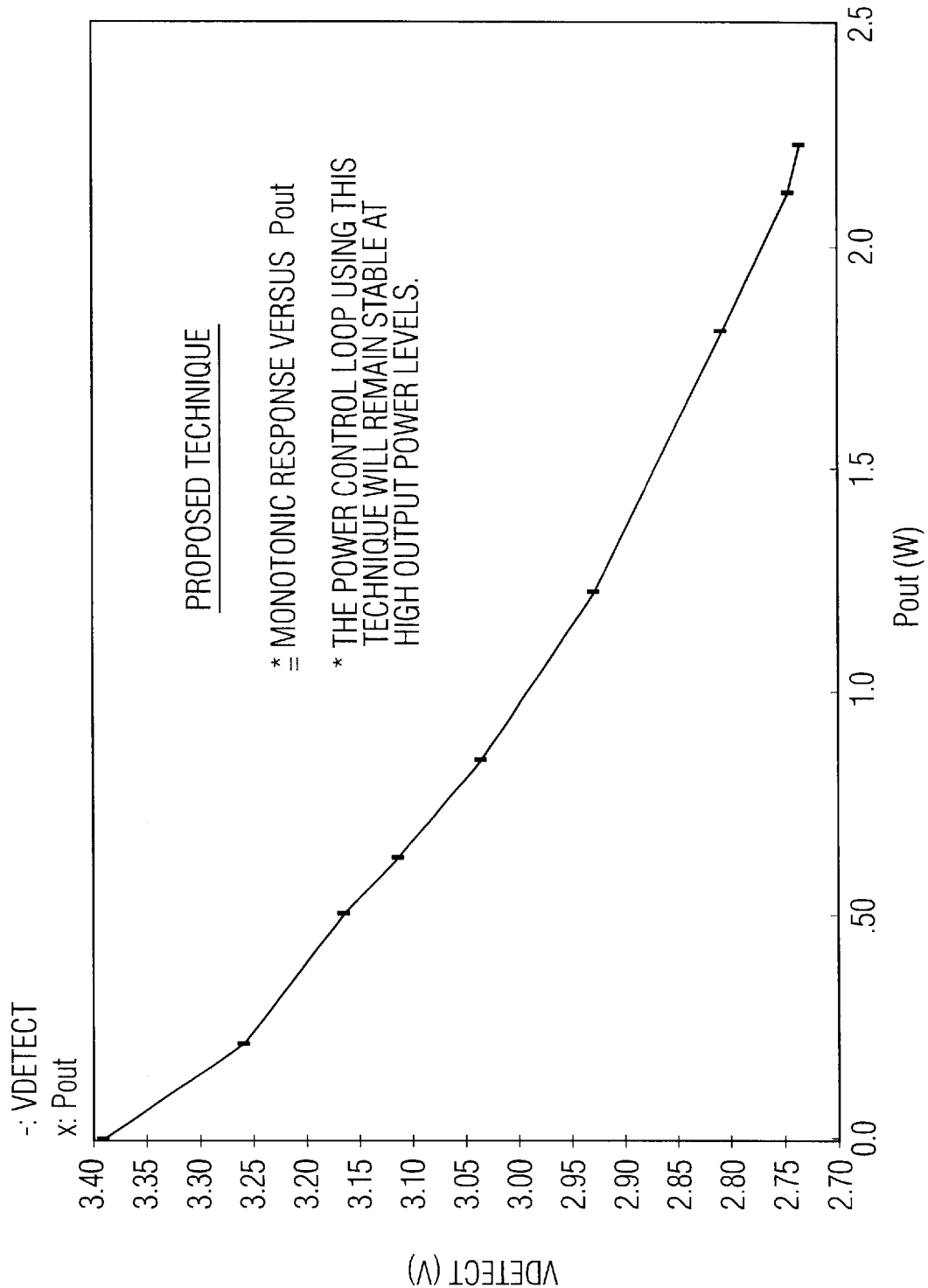
FIG. 5 shows the power transfer curve of the arrangement of FIG. 4.

A response curve showing $V_{detect}$ as a function of the output power of the device with a modified circuit in FIG. 4 is shown in FIG. 5. As can be appreciated from FIG. 5, there is no longer a positively sloped portion of the curve at higher output powers. This negatively sloped curve is important in feedback systems, which can become unstable when the slope of the curve turns positive as in the prior system depicted at FIG. 2.

Figure 6:
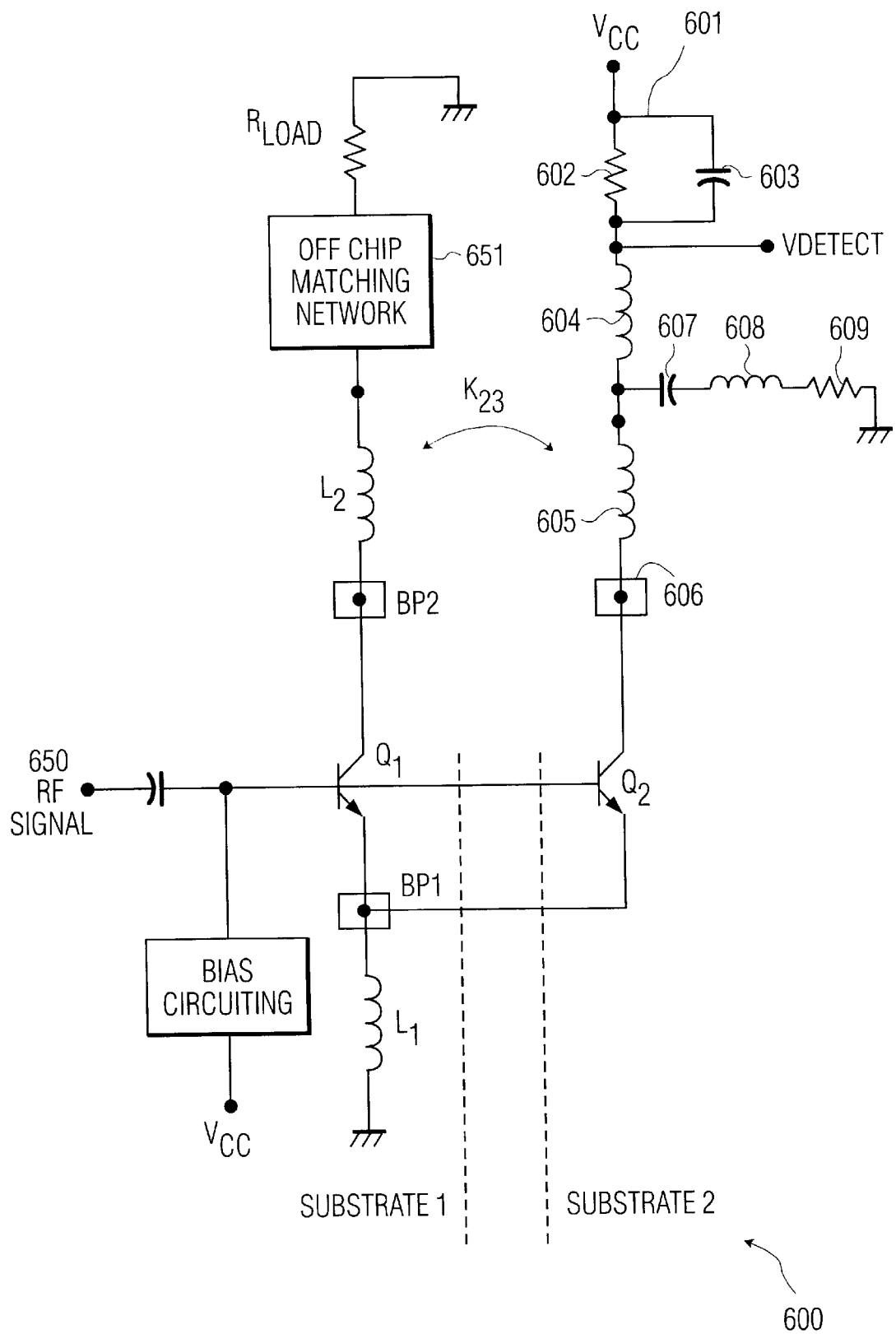
FIG. 6 shows an alternative embodiment of the present invention.

An alternative embodiment of the present invention is shown in FIG. 6. Most of the components are substantially similar to those previous described with respect to FIG. 4, and thus, we will not repeat the description.

An averaging circuit 601 comprises a resistor 602 and capacitor 603. Two series inductors 604 and 605 are utilized. Inductor 604 (which can also be a transmission line) provides a large inductance at RF. Inductor 608 and resistor 609 are parasitic components inherent in the installed capacitor 607. The remainder of the operation of the circuit is as before.

Inductors 605 and 608 act in conjunction with capacitor 607 as a resonant circuit. The inductor 605 represents the inductance of the bonding pad 606. Capacitor 607 and inductors 608 and 605 are chosen such that the resonant frequency of the circuit is at substantially the same frequency as the input RF signal.

At the desired frequency, the path into the collector of $Q_2$ becomes short, and thus, the distortion that disrupts the measurement is reduced. It is noted however, that the embodiment of FIG. 6 may be less preferable to that of FIG. 4. This is due to the fact that the coupling $K_{23}$ shown in FIG. 6 is not significantly reduced by the use of a resonant circuit in the manner of FIG. 6, whereas in the embodiment of FIG. 4, such coupling is virtually eliminated. To minimize $K_{23}$ coupling, the wirebonds and pin-outs must be apart from each other. To further decrease the coupling, a ground wirebond/ground pin should separate them.

Figure 3:
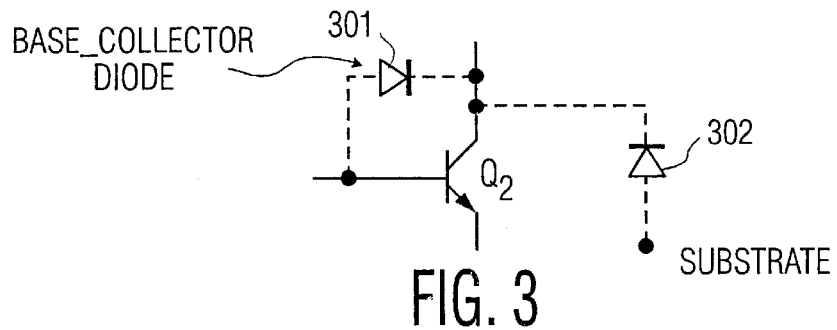
FIG. 3 shows the inherent diodes in a transistor device utilized in the arrangement of FIG. 1.

However, the embodiment of FIG. 6 eliminates the two sources of error discussed above with respect to FIG. 3, and has the potential advantage of not requiring any on chip fabrication of components, as would be required for the embodiment depicted in FIG. 4. The choice between the two techniques, or other techniques of implementing a shorting circuit in parallel with the measurement transistor $Q_2$, is a choice for the designer.

It is understood that while the foregoing describes the preferred embodiment of the invention, various other modifications and additions will be apparent to those of skill in the art.

What is claimed is:

1. Apparatus comprising a first transistor for delivering power to a specified load, a second transistor connected in parallel with said first transistor, said second transistor having a collector, said collector being connected to a first series combination of a first inductor, a second inductor, and an averaging circuit, said first and second inductors being joined at a junction, said junction also being connected to a second series combination of a resistor, capacitor, and an inductor.

2. The apparatus of claim 1 wherein said first transistor is connected to a radio frequency (RF) source, and wherein said second series combination and said first inductor combined have a resonance frequency substantially equal to said RF source.

3. The apparatus of claim 2 wherein said first and second transistors are fabricated on different substrates.

4. Apparatus of claim 2 further comprising a matching network, said matching network not being located on an integrated circuit on which said first transistor is located.

5. Apparatus of claim 3, wherein said first and second transistors form an integrated circuit, and comprising a resonant circuit in parallel with said second transistor, said resonant circuit comprising an inductor formed from a bonding pad.

6. Apparatus of claim 5 further comprising a matching network, said matching network not being located on an integrated circuit on which said first transistor is located.

7. The arrangement of claim 5 wherein said second transistor has a collector, and wherein the averaging circuit is connected to said collector.

8. The arrangement of claim 7 wherein said first transistor is arranged to drive a load comprising a wireless communications device.

9. The arrangement of claim 7 wherein said first transistor is connected at its base to both a capacitor and a set of bias circuitry.

10. The arrangement of claim 9 wherein said first transistor is connected at its base to both a capacitor and a set of bias circuitry.

* * * * *